United States Patent [19]
Nakata

[11] Patent Number: 5,030,584
[45] Date of Patent: Jul. 9, 1991

[54] METHOD FOR FABRICATING MOS SEMICONDUCTOR DEVICE OPERABLE IN A HIGH VOLTAGE RANGE USING POLYSILICON OUTDIFFUSION

[75] Inventor: Hidetoshi Nakata, Tokyo, Japan

[73] Assignee: NEC Corporation, Japan

[21] Appl. No.: 417,832

[22] Filed: Oct. 6, 1989

[30] Foreign Application Priority Data

Oct. 6, 1988 [JP] Japan ................ 63-252684

[51] Int. Cl.[5] .................. H01L 21/225; H01L 21/335
[52] U.S. Cl. ..................... 437/44; 437/162; 437/193; 437/50
[58] Field of Search ............ 437/193, 162, 44, 41, 437/43, 50, 60, 40; 357/23.3, 23.4

[56] References Cited

U.S. PATENT DOCUMENTS

| | | | |
|---|---|---|---|
| 4,063,967 | 12/1977 | Graul et al. | 437/162 |
| 4,296,426 | 10/1981 | Gilles | 437/162 |
| 4,367,580 | 1/1983 | Guterman | 437/43 |
| 4,433,468 | 2/1984 | Kawamata | 437/56 |
| 4,808,555 | 2/1989 | Mauntel et al. | 437/193 |

FOREIGN PATENT DOCUMENTS

| | | | |
|---|---|---|---|
| 0196573 | 12/1982 | Japan | 437/162 |
| 0047687 | 4/1987 | Japan | 437/162 |
| 0147774 | 7/1987 | Japan | 437/162 |

*Primary Examiner*—Brian E. Hearn
*Assistant Examiner*—T. N. Quach
*Attorney, Agent, or Firm*—Laff, Whitesel, Conte & Saret

[57] ABSTRACT

A method of fabricating an MOS semiconductor device having the improved current-flowing characteristics with ease is disclosed. The method is featured as follows. First, a gate electrode covered by an insulator is formed on a gage insulating film on a semiconductor substrate, portions of the gate insulating film, above source and drain formation areas are removed and polycrystalline silicon layer doped with an impurity of the opposite type so that of the semiconductor substrate is selectively formed on the source and drain formation regions. Then, the impurity of the polycrystalline silicon is thermally diffused into the source and drain and formation region thereby to form shallow source and drain regions. Then, source and drain electrodes contacting with parts of the polycrystalline silicon.

5 Claims, 6 Drawing Sheets

METHOD FOR FABRICATING MOS SEMICONDUCTOR DEVICE OPERABLE IN A HIGH VOLTAGE RANGE USING POLYSILICON OUTDIFFUSION

BACKGROUND OF THE INVENTION

1. Field of the Invention

The present invention relates to a method for fabricating an MOS semiconductor device, and particularly to a method for fabricating an MOS transistor having the LDD (Lightly Doped Drain/Source) structure.

2. Description of the Related Art

As integrated circuit technology progresses to achieve a higher performance and a higher integration density, the requirement on the MOSFET device becomes more demanding. In particular, phenomena such as lowering in breakdown voltage, hot electron effects, and short-channel effects, which result from high-field intensities in a channel region, limit the minimum channel length and maximum operating voltages. Under the above circumstance, a self-aligned, Lightly Doped Drain Field-Effect Transistor (LDDFET) has been proposed.

According to this technique, narrow N⁻ regions are added between a channel region and N+ drain and source regions so that a peak electric field in the channel is reduced, resulting in a significant increase in the allowable operating voltage, and a reduction in gate-source/drain capacitance.

The LDD type MOS device is conventionally fabricated as follows. First, a gate electrode is formed on an active region of a P-type surrounded by a field oxide layer via a gate insulating layer. Then, N-type impurities such as phosphorus are lightly implanted into a surface of the active region to form shallow N⁻ regions. Subsequently, a masking layer is selectively formed above the channel region and its peripheral regions of the shallow N⁻ regions, and then N-type impurities such as boron are introduced into the surface of the active region to form deep source and drain contact regions. However, in the conventional method, it is difficult to form the shallow regions at high impurity concentration and therefore sheet resistance of the shallow regions is high. Therefore, effective resistances of the drain and source regions are large and current amount flowing therethrough is limited. Even if the shallow regions of high impurity concentration is formed, the depletion layers from such shallow regions extend widely to cause so-called short channel effect. Moreover, it is difficult to form the masking layer precisely, because the masking layer is formed by independent mask-align procedure. Thus, it is difficult to form the shallow regions in the precise relationship with the gate and the drain/source regions.

SUMMARY OF THE INVENTION

It is an object of the present invention to provide the method of fabricating a MOS device having improved current-flowing characteristics.

It is another object of the present invention to provide the method of fabricating a MOS device with accurate alignment of the lightly doped drain and source regions with ease.

According to the fabricating method of the semiconductor device of the present invention, first a gate insulating film is formed on the surface of a semiconductor substrate in an element region surrounded by an element isolating region, and a gate electrode is formed thereon, and an insulator film is formed on the surface of the gate electrode. Subsequently, the gate insulating film in a part not being covered with the gate electrode and at least abutting on the gate electrode is removed. Next, a polycrystalline silicon layer is formed on the entire surface of the substrate (polycrystalline silicon is formed thick in the sidewall part of the gate electrode, and anisotropic etching is applied to this polycrystalline silicon layer so that the polycrystalline silicon layer is left only in the sidewall part of the gate electrode. During or after the formation of the polycrystalline silicon layer, this layer is lightly doped with an impurity whose conductivity type is opposite to that of the semiconductor substrate. Thereafter an impurity of the conductivity type opposite to that of the semiconductor substrate is ion-implanted to form a diffused layer of high impurity concentration on the surface of the polycrystalline silicon layer, and when an exposed part of the gate insulating film is left, the diffused layer of high concentration (a source-drain region of high concentration) is also formed in the part. Subsequently, heat treatment is conducted to activate the impurity of the diffused layer of high concentration and also to diffuse the impurity from the polycrystalline silicon layer of relatively low concentration into the semiconductor substrate, so as to form a diffused layer of low impurity-concentration (a source-drain region of low impurity-concentration). Next, an interlayer insulator film is formed on the entire surface of the substrate, a contact hole exposing the surface of the polycrystalline silicon layer at least is formed in said interlayer insulator film, and an electrode is formed in the hole.

According to the present invention, the diffused layer serving as a drain or a source is formed with a shallow junction and at a low impurity concentration. Therefore, a short-channel effect can be prevented by the existance of the shallow low impurity concentration. Thus the device can be operable with a high voltage. And moreover, an effective internal resistance of the diffused layer is greatly reduced because the polycrystalline silicon contacted with the surface of the diffused layer serves as contact member for drawing a drain or source electrode.

BRIEF DESCRIPTION OF THE DRAWINGS

The above and further objects, features and advantages of the present invention will become more apparent from the following detailed description taken in conjunction with the accompanying drawings, wherein.

DETAILED DESCRIPTION OF THE INVENTION

Description of the Prior Art

A conventional method of fabricating an LDD type MOS transistor in the prior art will be explained with reference FIGS. 1A to 1D and 2.

Figure 1A:
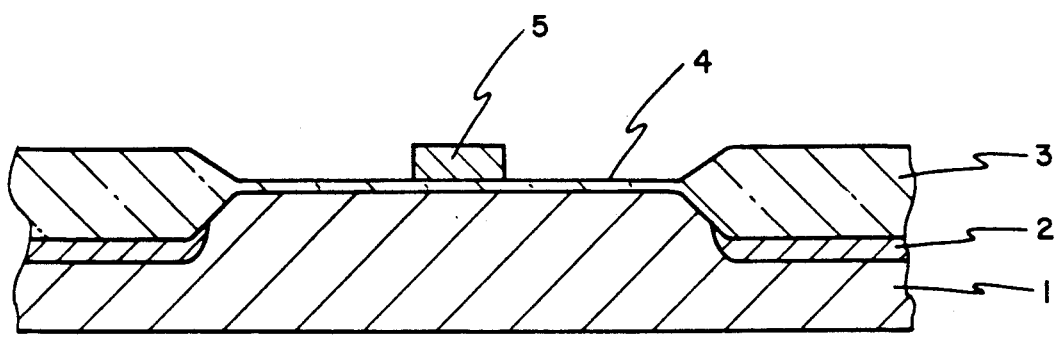
FIGS. 1A to 1D are sectional views showing major steps of fabricating an MOS device in the prior art.
Figure 1B:
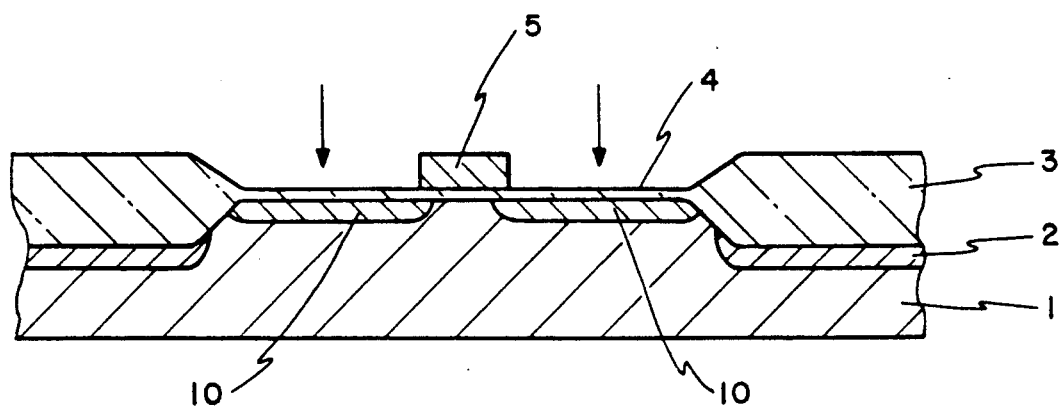
Figure 1C:
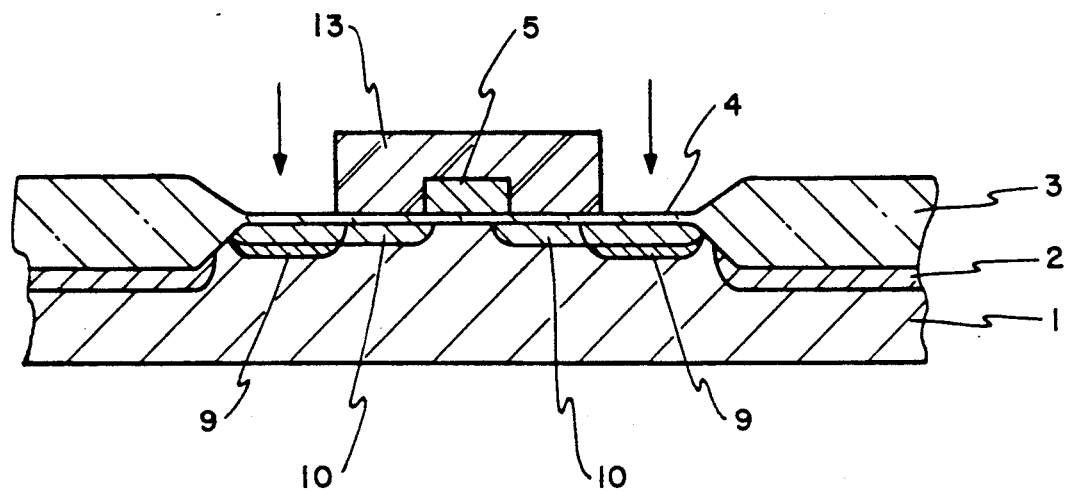

First, as shown in FIG. 1A, in a semiconductor substrate 1 of P-type, an active (element) region is surrounded by a thick field oxide layer 3 serving as an isolating insulator and a channel stopper region of P+ type 2 and a thin gate insulating layer 4 and a gate electrode 5 made of polycrystalline silicon are formed in a known way. Subsequently, an impurity, of N type, such as phosphorus opposite to that of the semiconductor substrate 1, i.e. P-type is ion-implanted using the gate electrode 5 and the isolating insulator film 3 as a mask, so as to form a N-type shallow regions 10 of low impurity concentration, as shown in FIG. 1B. Next, with the gate electrode 5 covered with a masking material 13 such as a photoresist, an impurity of the N conductivity type is ion-implanted in high concentration, so as to form deep N-type regions 9 of high impurity concentration, as shown in FIG. 1C. Then, after, the masking material 13 is removed, an interlayer insulator film 11 is formed, and contact holes are opened, and electrode wirings 12 contacted to the regions 9 via the holes are formed, shown in FIG. 1D.

Figure 1D:
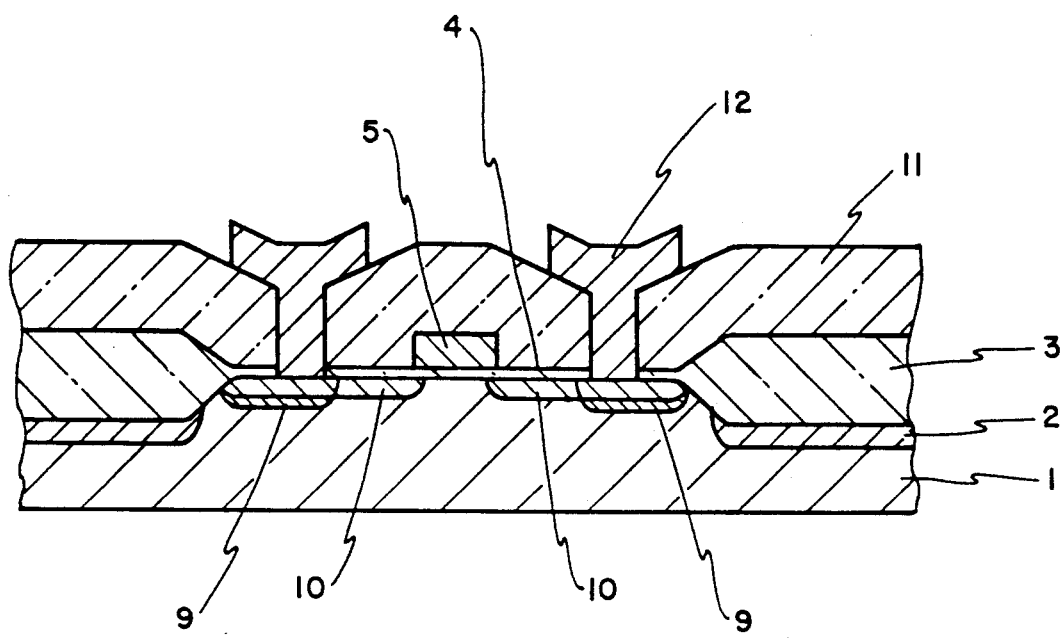
Figure 2:
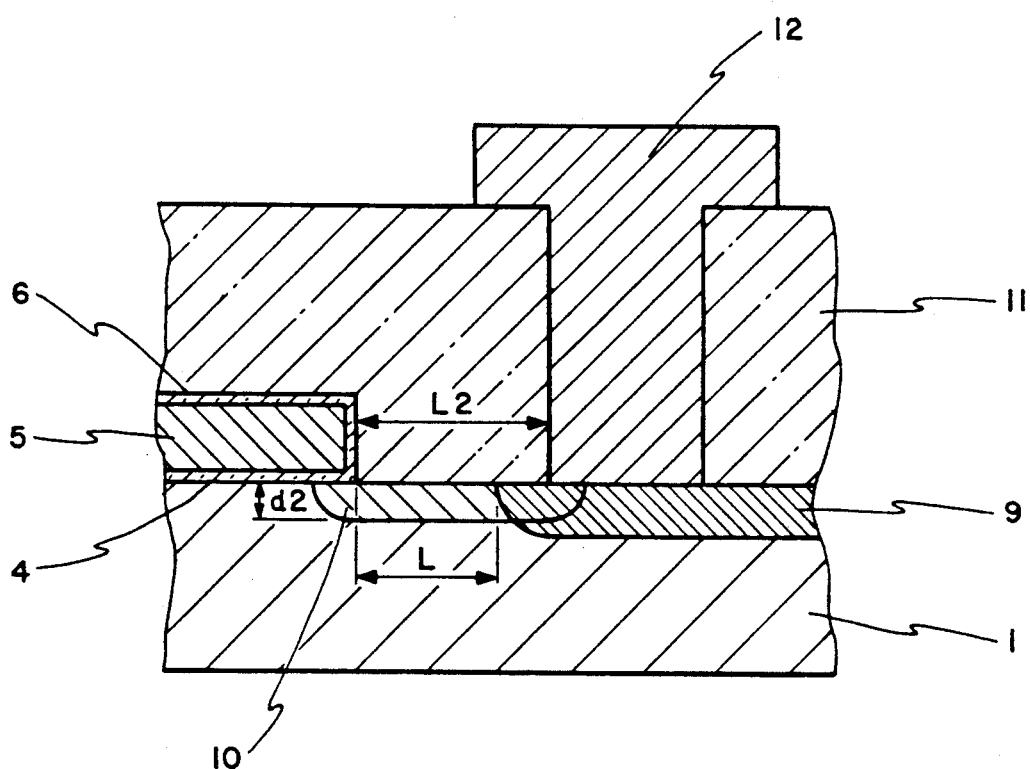
FIG. 2 is an enlarged sectional view of a part of the MOS device in the prior art.

In the MOS device according to the conventional method of described above, the shallow region 10 of low impurity-concentration, which have high resistance, exists over a distance L between the electrode wiring 12 and the gate electrode 5 as shown in FIG. 2, a partially enlarged view of FIG. 1D. Consequently it is impossible to let a large current flow therethrough and this decreases the operation speed of the device.

Besides, the connection of the electrode wiring 12 with the diffused region 10 of low concentration makes it impossible to obtain a stable ohmic connection, and in addition, there is a danger of short-circuiting the electrode wiring 12 and the semiconductor substrate 1 since the depth of the diffused region 10 of low impurity-concentration is so small as d 2 in FIG. 2. Accordingly, the connection of the electrode wiring 12 with the diffused region 10 needs to be made in the region of the diffused region 9 of high impurity-concentration. Thus, a gap 12 between the electrode wiring 12 and the gate electrode 5 can not be made smaller than the gap L between the gate electrode 5 and the diffused region 9 of high impurity-concentration. Therefore it is difficult to make the device small in size according to the conventional method.

In addition, the conventional method requires a masking process of forming the masking material 13 to form two kinds of diffused regions, the diffused region 10 of low impurity-concentration and the diffused layer 9 of high impurity-concentration, and thereby processes are complicated.

Description of the Embodiments

With reference to FIGS. 3A to 3J, the method of fabricating the MOS device according to a preferred embodiment of the invention will be explained.

In the following drawings, the portions or elements corresponding to those in FIGS. 1A–1D and 2, are denoted by the same or similar references and explanation therefor will be omitted.

Figure 3A:
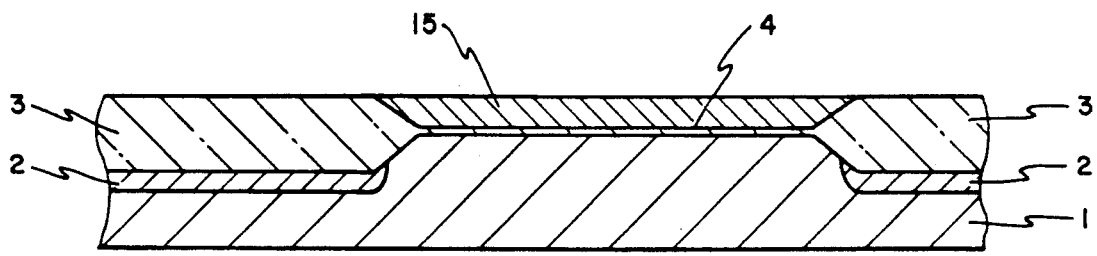
FIGS. 3A to 3J are sectional views showing major steps of fabricating an MOS device according to one embodiment of the present invention.
Figure 3B:
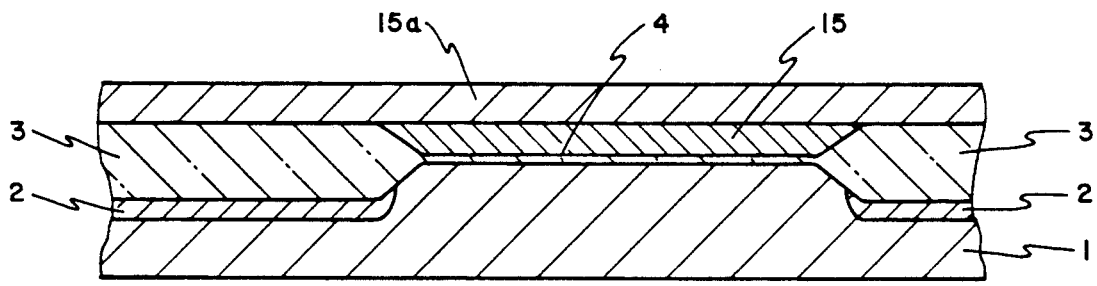
Figure 3C:
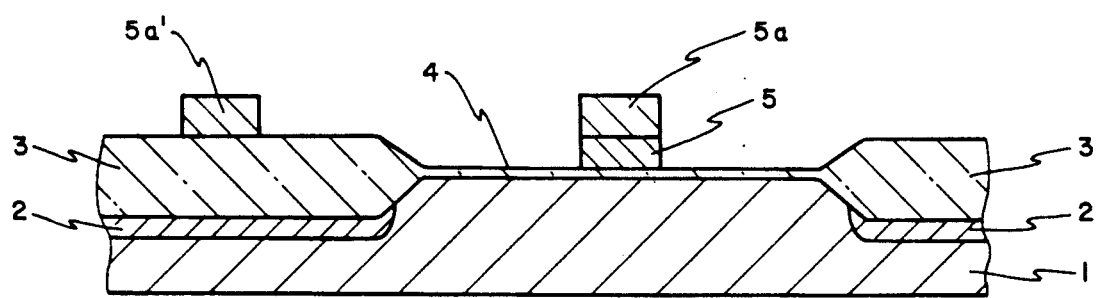
Figure 3D:
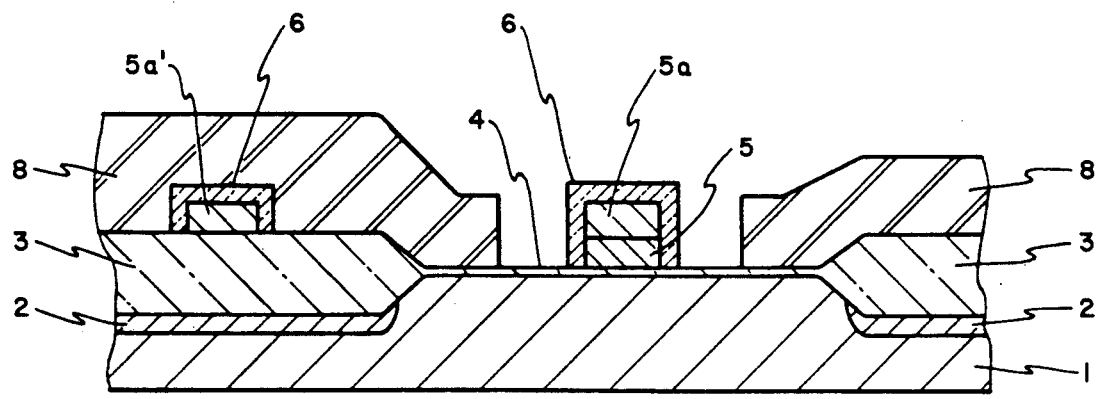
Figure 3E:
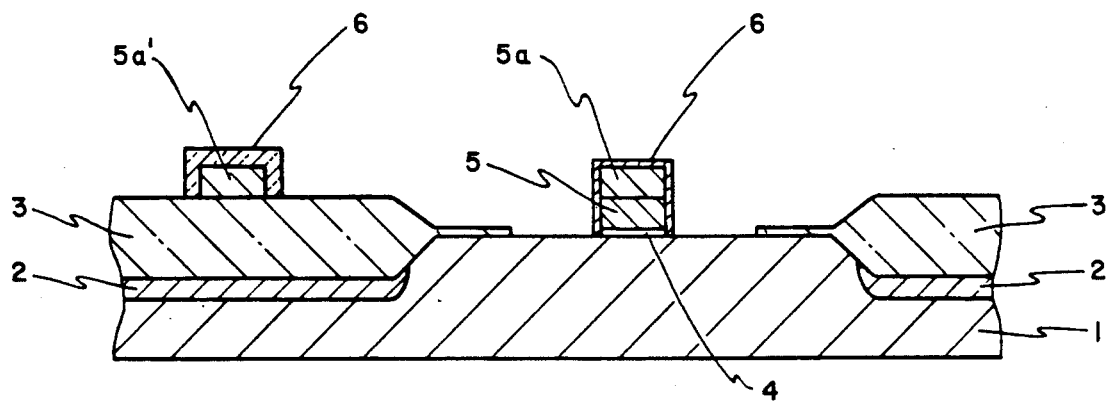

First, an element region having a gate insulating film 4 is defined on a p-type semiconductor substrate 1, and also an element isolating region having a channel stopper 2 on the surface of the substrate and an element isolating insulator (field oxide) film 3 on the stopper is formed thereon. Then, a first polycrystalline silicon layer containing an impurity, e.g. phosphorus, is formed on the entire surface. Then, a leveling substance, e.g. a photoresist, is applied thereon (not shown), and the entire surface coated with the substance is exposed to an etching atmosphere having an equal etching rate for the polycrystalline silicon layer and the photoresist, so that the first polycrystalline silicon layer 15 be formed only in the element region, as shown in FIG. 3A. Subsequently, as shown in FIG. 3B, a second polycrystalline silicon layer 15a containing an impurity, e.g. phosphorus, is formed on the entire surface. Next, as shown in FIG. 3C, a gate electrode made of the layers 5 and 5a is formed on the gate insulating film 4, while a wiring 5a' is formed on the element isolating insulator film 3, by a known photoetching technique. Next, as shown in FIG. 3D, steam oxidation at low temperature, e.g. steam oxidation at 800° C., is applied to form a thick oxide film 6 on the surfaces of the gate electrode (5, 5a) and the wiring 5a' by utilizing increased-speed oxidation, and then protection is made by a photoresist 8 except for the peripheral part of the gate electrode 5, 5a. By a known etching technique, subsequently, the gate insulating film 4 in a prescribed area of the element region is removed by etching in a state wherein the oxide film 6 on the surface of the gate electrode (5, 5a) is left by utilizing a difference in the film thickness of the insulator film, so that the surface of the semiconductor substrate 1 is exposed as shown in FIG. 3E, and the photoresist 8 is removed.

Figure 3F:
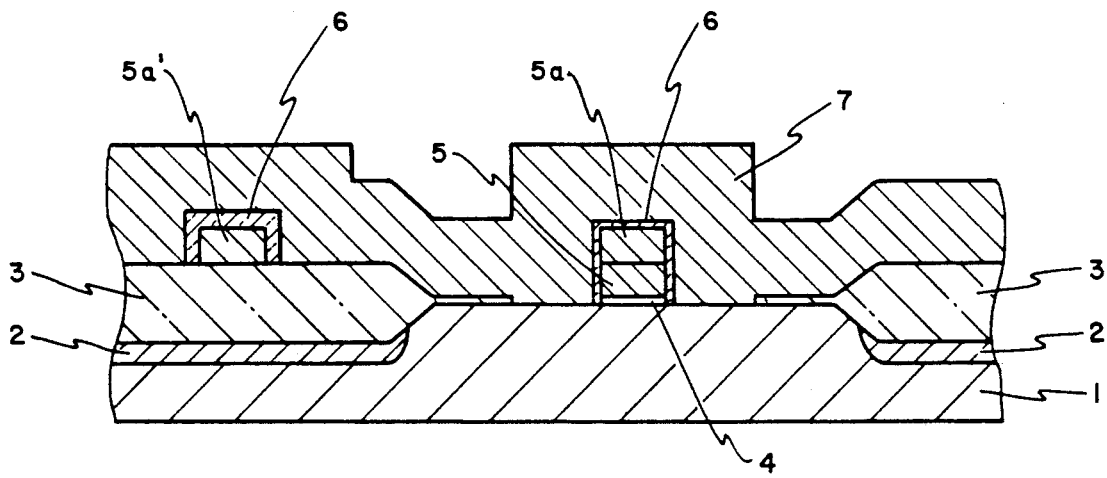
Figure 3G:
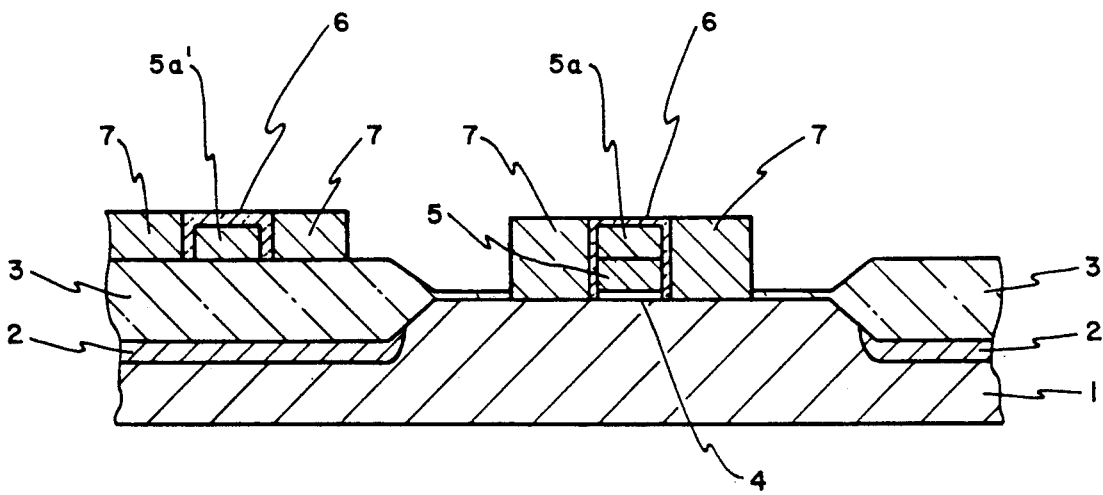
Figure 3H:
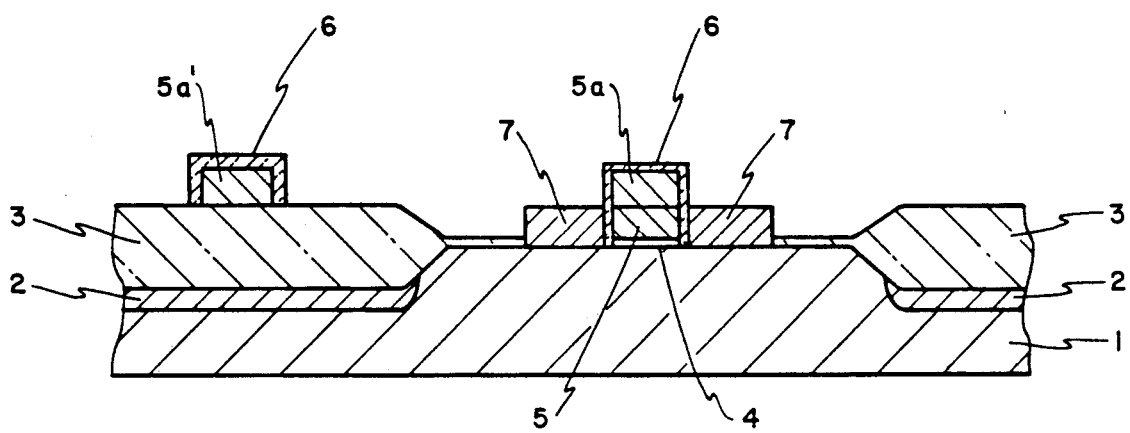
Figure 3I:
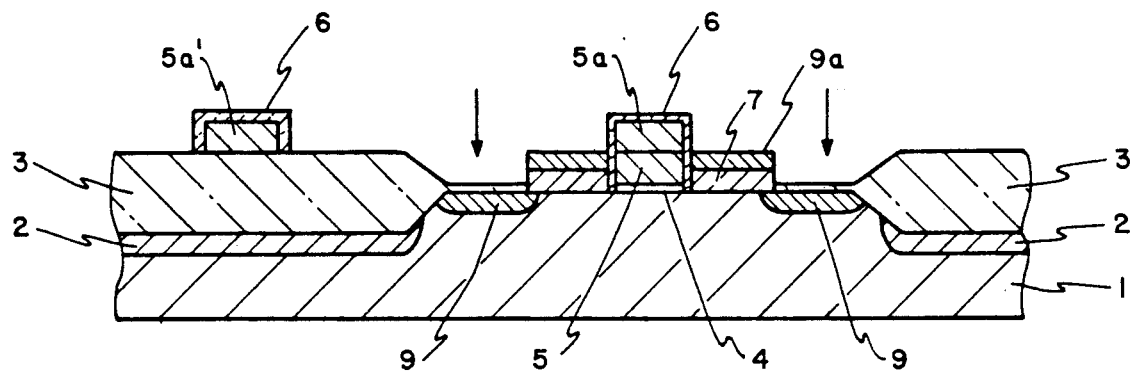
Figure 3J:
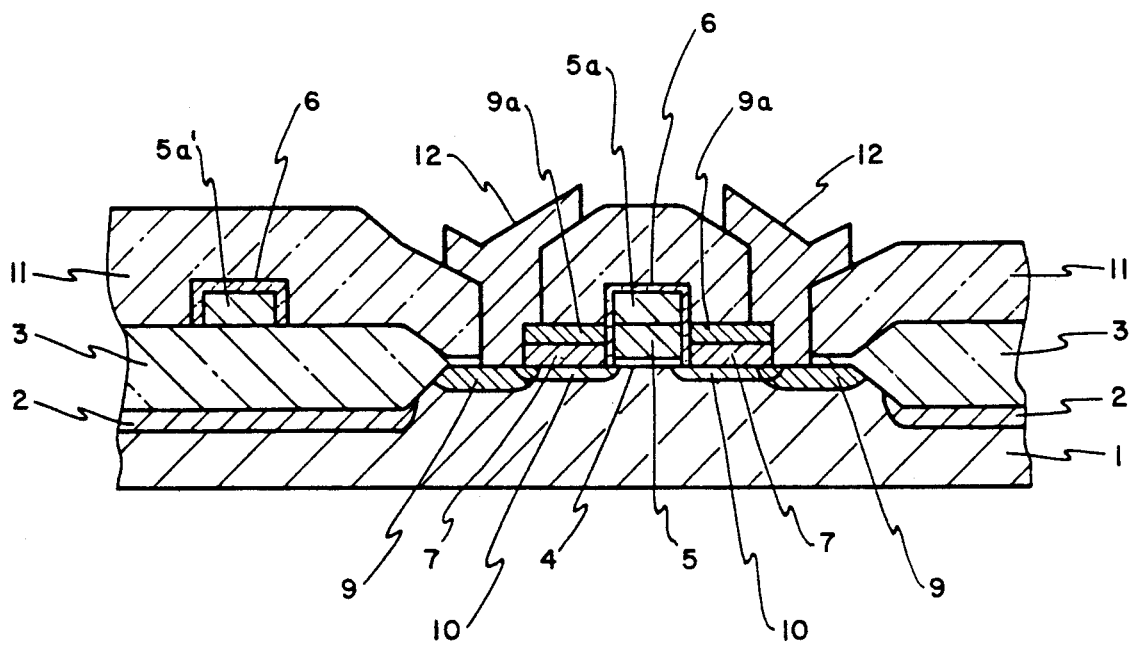

Next, as shown in FIG. 3F, a third polycrystalline silicon layer 7 containing an impurity, e.g. phosphorus, of low concentration, e.g. $1 \times 10^{16}$ cm$^{-3}$ to $1 \times 10^{19}$ cm$^{-3}$, is formed on the entire surface of the substrate. This polycrystalline silicon is formed thicker around the gate electrodes 5, 5a. Subsequently the entire surface is exposed to an anisotropic etching atmosphere, so as to remove by etching the third polycrystalline silicon layer 7 in a part except for the sidewall parts of the gate electrode (5, 5a) and the wiring 5a' as shown in FIG. 3G. In succession, the entire surface is exposed further to the anisotropic etching atmosphere to e-ch away all the polycrystalline silicon layer 7 except its portions on the sidewall part of the gate electrode 5 as shown in FIG. 3H. Next, as shown in FIG. 3I, an impurity, e.g. phosphorus or arsenic, of the conductivity type opposite to that of the semiconductor substrate 1 is ion-implanted in the third polycrystalline silicon layer 7 and the semiconductor substrate 1 with the element isolating insulator film 3 and the gate electrode (5, 5a) used as a mask, so as to form diffused layers 9, 9a of impurity concentration of about $1 \times 10^{19}$ cm$^{-3}$ to $1 \times 10^{21}$ cm$^{-3}$, cm$^{-3}$, and then heat treatment at 800° C. to 1000° C., for instance, is conducted to diffuse the phosphorus from the third polycrystalline silicon layer 7 formed on the sidewall of the gate electrode 5 into the semiconductor substrate 1, so as to form a shallow diffused layers 10 of low concentration, as shown in FIG. 3J. Simultaneously the impurity in the diffused layers 9, 9a is activated. Thereafter an interlayer insulator film 11 is formed on the surface of the substrate, and contact holes are opened therein, and electrode wirings 12 are formed in the hole.

Figure 4:
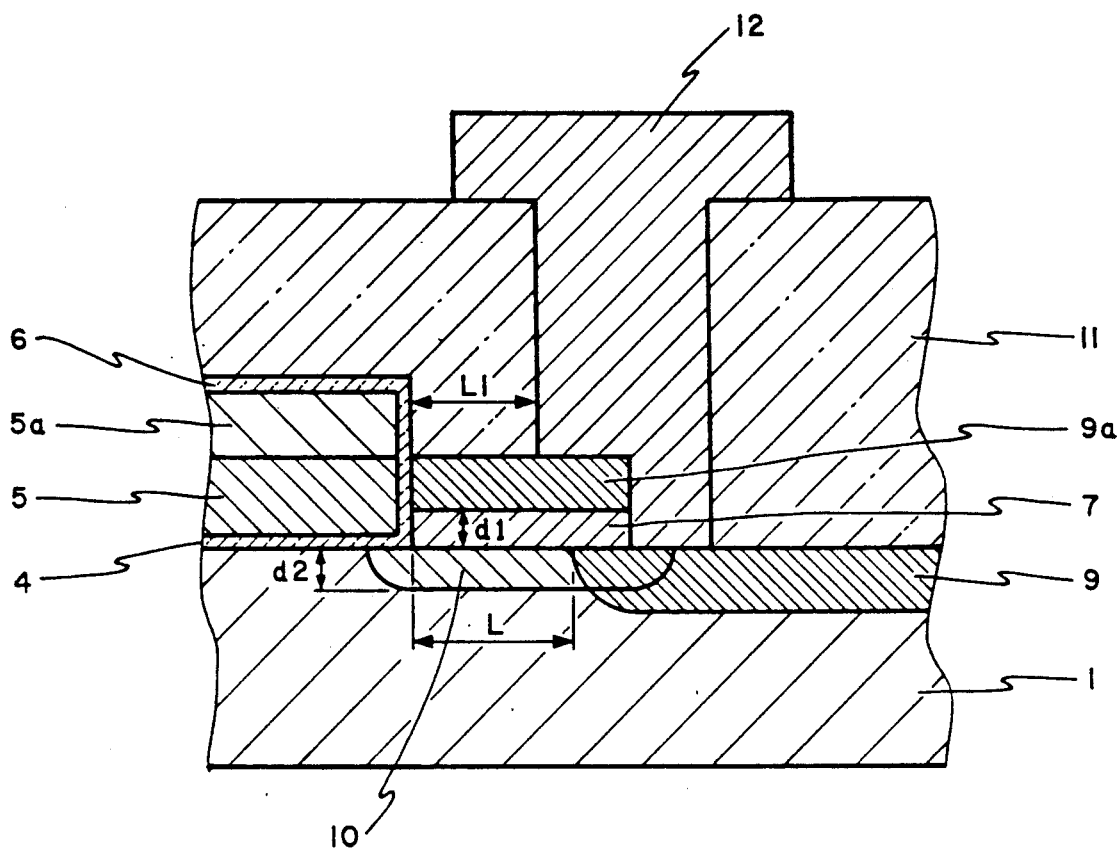
FIG. 4 is an enlarged sectional view showing a part of the MOS device shown in FIG. 3J.

In the semiconductor device fabricated according to the present invention, therefore, the length of the low-concentration diffused layer 10 from the end of the gate electrode (5, 5a) to the end of the high-concentration diffused layer (9) is reduced substantially to be d1 as shown in FIG. 4, which is the partially enlarged view of FIG. 3J, in contrast to the length in the prior-art example which is L as shown in FIG. 2, and consequently a resistance value of a source and a drain can be reduced (d1 is the thickness of the polycrystalline silicon layer 7 of low impurity concentration), in addition to the advantage of the LDD structure, i.e. high operating voltage.

Figure 5:
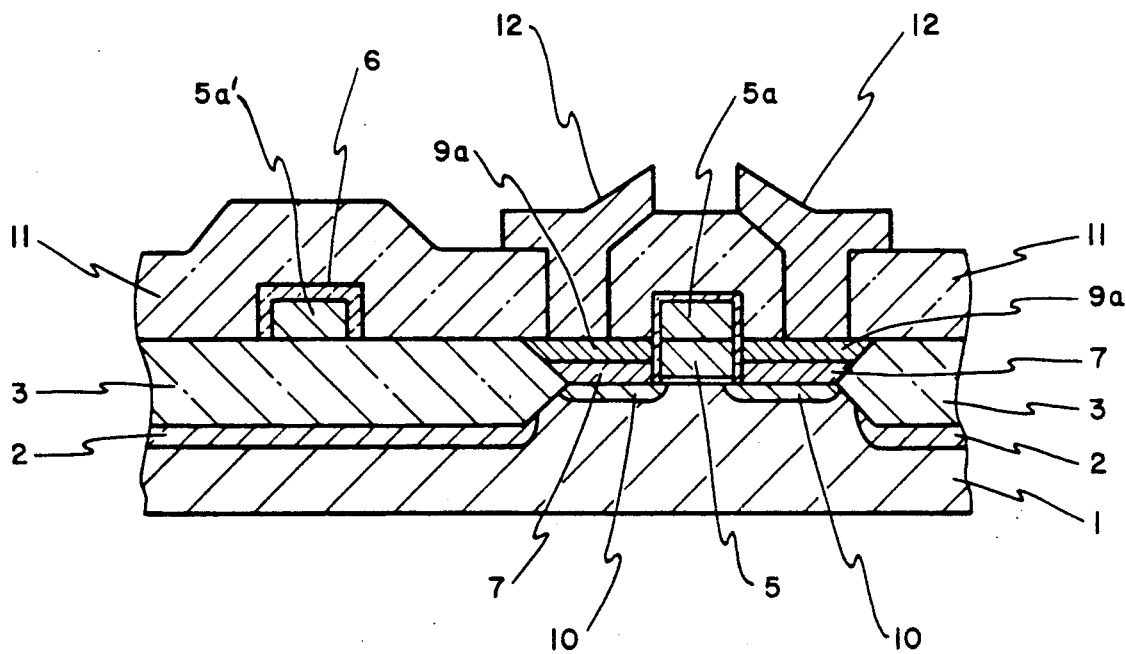
FIG. 5 is a sectional view of an MOS device according to another embodiment of the invention.

Next, another embodiment of the present invention will be described with reference to FIG. 5. This embodiment is a modification of the embodiment of FIG. 3 in that (1) a gap of the element isolating insulator film 3 is lessened (that is, the element region is narrowed) and that (2) all the gate insulated film not covered with the gate electrodes 5, 5a is removed in the processes of FIGS. 3D and 3E. Thereby the third polycrystalline silicon layer 7 can be put in a state of being buried in the element region, and thus the reduction of an area occupied by the element and the leveling of the surface form thereof can be realized simultaneously.

According to the present invention, the polycrystalline silicon layer of the double-layer structure exists on the source-drain region which is the low-concentration diffused layer. This enables the formation of the electrode wiring 12 on the low-concentration diffused layer 10, and thereby a gap $L_1$ between the gate electrode 5, 5a and the electrode wiring 12 can be made smaller than the length L of the low-concentration diffused layer from the end of the gate electrode to the end of the high-concentration diffused layer, thus enabling the reduction of an area occupied by a transistor.

According to the present invention, moreover, the polycrystalline silicon layer 7 for forming the low-concentration diffused layer 10 can be formed without taking any particular photo-mask process. This enables the omission of a masking process for forming the masking material 13 which is necessitated in prior art, and therefore processes can be simplified.

What is claimed is:

1. A method of fabricating an MOS semiconductor device comprising the steps of:
   forming a gate insulating film on an element region of a semiconductor substrate of a first conductivity type,
   simultaneously forming a first polycrystalline silicon pattern on said gate insulating layer, a second polycrystalline silicon pattern on said first polycrystalline silicon pattern in order to provide a gate electrode formed of said first and second polycrystalline silicon patterns, and a third polycrystalline silicon pattern on a region other than said gate insulating film,
   forming an insulator film on the surface of said gate electrode,
   selectively removing at least first and second portions of said gate insulating film, said first and second portions being not covered by said gate electrode but being adjacent to first and second sides of said gate electrode, respectively,
   forming a polycrystalline silicon layer of a second conductivity type on the entire surface of said substrate,
   forming anisotropic etching to said polycrystalline silicon layer so as to remove said polycrystalline silicon layer except portions thereof above said first and second portions,
   doping only a surface portion of the remaining portions of said polycrystalline silicon layer with an impurity of said second conductivity type to change only said surface portion of the remaining portions of said polycrystalline silicon layer to a diffused layer of high impurity concentration,
   conducting a heat treatment to diffuse the impurity from the remaining portions of said polycrystalline silicon layer into said semiconductor substrate in order to form source and drain regions of low impurity concentration, and
   forming electrodes at least a part of which is in contact said diffused layer of high impurity concentration of said polycrystalline silicon layer.

2. The method according to claim 1, in which said first and second polycrystalline silicon patterns are doped with the same conductivity type impurities.

3. The method according to claim 1, in which the step of selectively removing said gate insulating layer includes the steps of forming a photoresist film on the surface of said substrate having openings exposing said first and second portions, and etching said first and second portions of said gate insulating film.

4. The method according to claim 1, further comprising the steps of introducing an impurity of said second conductivity type into the surface of said element region by using said gate electrode and the remaining portions of said polycrystalline silicon thereby to form source and drain contact regions having junctions deeper than those of said source and drain regions, respectively.

5. The method according to claim 1, further comprising the step of forming an element isolating insulating layer surrounding said element region before the step of forming said gate insulating film.

* * * * *